(12) United States Patent
Chen

(10) Patent No.: US 6,278,319 B1
(45) Date of Patent: Aug. 21, 2001

(54) INPUT-BUFFERING DEVICE

(75) Inventor: Chih-Hung Chen, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/574,374

(22) Filed: May 19, 2000

(30) Foreign Application Priority Data

May 12, 2000 (TW) .................................................. 89109104

(51) Int. Cl.[7] ........................................................ G05F 1/10
(52) U.S. Cl. ............................................ 327/538; 326/104
(58) Field of Search ..................................... 326/104, 112, 326/115, 119, 120, 121, 122; 327/538, 543

(56) References Cited

U.S. PATENT DOCUMENTS 5,440,248 * 8/1995 Brown et al. ........................... 326/71
5,929,679 * 7/1999 Ohwada ................................ 327/206

* cited by examiner

Primary Examiner—Tuan T. Lam
Assistant Examiner—Linh Nguyen
(74) Attorney, Agent, or Firm—Thomas, Kayden, Horstemeyer & Risley, LLP

(57) ABSTRACT

An input-buffering device having an adjustable voltage divider circuit for generating a bias voltage signal capable of preventing the shifting of trigger point when different source voltages are applied. The adjustable voltage divider circuit has a pull-up circuit for controlling the value of threshold voltage and a variable resistor for generating a bias voltage. In addition, the input-buffering device has at least one transistor group for controlling the rate of increase of the trigger point.

8 Claims, 2 Drawing Sheets

INPUT-BUFFERING DEVICE

CROSS-REFERENCE TO RELATED APPLICATION

This application claims the priority benefit of Taiwan application serial no. 89109104, filed May 12, 2000.

BACKGROUND OF THE INVENTION

1. Field of Invention

The present invention relates to an input-buffering device. More particularly, the present invention relates to the design of an adjustable voltage divider capable of generating a bias signal for controlling the first stage input buffering device of a NOR gate so that reversal of output signal difference at different times caused by trigger point shift is prevented.

2. Description of Related Art

Most conventional input buffering devices use a simple NOR gate structure to serve as a first stage input for transforming a transistor-transistor logic (TTL) signal into a CMOS standard sign. FIG. 1 is a circuit diagram of a conventional input-buffering device. As shown in FIG. 1, the circuit includes two PMOS transistors 10 and 12, two NMOS transistors 14 and 16 and five inverters 18, 20, 22, 24 and 26.

The source terminal of the PMOS transistor 10 is connected to a high voltage Vdd and the gate terminal is connected to a first input signal CECTL (Chip Enable Control). In addition, the source terminal of the PMOS transistor 12 is connected to the drain terminal of the PMOS transistor 10 and the gate terminal is connected to a second input signal AX. The drain terminal of the NMOS transistor 14 is connected to the drain terminal of the PMOS transistor 12. The gate terminal of the NMOS transistor 14 is connected to the second input signal AX while the source terminal is connected to a low voltage Vss. The drain terminal of the NMOS transistor 16 is connected to the drain terminal of the PMOS transistor 12. The gate terminal of the NMOS transistor 16 is connected to the first input signal CECTL while the source terminal of the NMOS transistor 16 is connected to the low voltage Vss.

The input terminal of the inverter 18 is connected to the drain terminal of the PMOS transistor 12. The input terminal of the inverter 20 is connected to the output terminal of the inverter 18, and the output terminal of the inverter 20 is connected to the drain terminal of the PMOS transistor 12. The input terminal of the inverter 22 is connected to the output terminal of the inverter 18, and the output terminal of the inverter 22 is connected to a first output signal $X_B$. The input terminal of the inverter 24 is connected to the output terminal of the inverter 18. The input terminal of the inverter 26 is connected to the output terminal of the inverter 24, and the output terminal of the inverter 26 is connected to a second output signal X.

The trigger point of the input buffering device shown in FIG. 1 is largely determined by the dimensions of the serially connected PMOS pull-up devices (that is, PMOS transistors 10 and 12) and the parallel-connected NMOS pull-down devices (that is, NMOS transistors 14 and 16). However, different ranges of source voltage Vcc (such as 4.5–5.5V, 2.7–3.6V and 1.8–2.2V) are often required due to market forces. If related products are used with a conventional input buffering device and identical signal magnitudes are input, a trigger point shift may occur due to a different in source voltage. Hence, high-to-low or low-to-high transmission of input TTL signal may be affected, leading to reversal of output signal difference at different times produced by the NOR gate output terminal. Hence, a fast and a slow transmission will result. Such a fluctuation in transmission speed under different range of source voltage often produces different reverse speed signal that may affect access time of high-speed product (such as synchronous SRAM).

SUMMARY OF THE INVENTION

Accordingly, one object of the present invention is to provide an input-buffering device capable of resolving trigger point shift problem resulting from source voltage fluctuation. An adjustable voltage divider circuit is used to control a first stage input buffer. Consequently, a rise in source voltage will only result in a small magnitude variation of the trigger point. Hence, no matter if the input signal transits from a low to-high or a high-to-low level, timing of the reverse signal produced by the input buffer at the output terminal is uniform. Since transmission rate is uniform, an imbalance in input signal transmission due to source voltage variation is reduced. Ultimately, data access timing of the electronic device is in an optimally balanced state.

To achieve these and other advantages and in accordance with the purpose of the invention, as embodied and broadly described herein, the invention provides an input-buffering device. The device includes a first PMOS transistor, a second PMOS transistor, a first NMOS transistor, a second NMOS transistor, a first inverter, a second inverter, a third inverter, a fourth inverter, a fifth inverter, at least one group transistor assembly and an adjustable voltage divider circuit. The source terminal of the first PMOS transistor is connected to a high voltage. The gate terminal of the first PMOS transistor receives a first input signal. The source terminal of the second PMOS transistor is connected to the drain terminal of the first PMOS transistor. The gate terminal of the second PMOS transistor receives a second input signal. The drain terminal of the first NMOS transistor is connected to the drain terminal of the second PMOS transistor. The gate terminal of the first NMOS transistor receives the second input signal. The source terminal of the first NMOS transistor is connected to a low voltage. The drain terminal of the second NMOS transistor is connected to the drain terminal of the second PMOS transistor. The gate terminal of the second NMOS transistor receives the first input signal. The source terminal of the second NMOS transistor is connected to the low voltage.

The input terminal of the first inverter is connected to the drain terminal of the second PMOS transistor. The input terminal of the second inverter is connected to the output terminal of the first inverter and the output terminal of the second inverter is connected to the drain terminal of the second PMOS transistor. The input terminal of the third inverter is connected to the output terminal of the first inverter. The output terminal of the third inverter outputs a first output signal. The input terminal of the fourth inverter is connected to the output terminal of the first inverter. The input terminal of the fifth inverter is connected to the output terminal of the fourth inverter. The output terminal of the fifth inverter outputs a second output signal.

Each transistor assembly includes a first control NMOS transistor and a second control NMOS transistor. The drain terminal of the first control NMOS transistor is connected to the drain terminal of the second PMOS transistor. The gate terminal of the first control NMOS transistor receives the second input signal. The drain terminal of the second control NMOS transistor is connected to the source terminal of the first control NMOS transistor. The source terminal of the second control NMOS transistor is connected to the low voltage. The adjustable voltage divider circuit generates a bias voltage signal and transmits the same to the gate terminal of the second control NMOS transistor.

The adjustable voltage divider circuit includes a pull-up circuit for controlling the value of a threshold voltage and a variable resistor connected to the pull-up circuit for generating a bias voltage signal. The pull-up circuit includes at least one pull-up PMOS transistor and a control PMOS transistor. The source terminal of the pull-up PMOS transistor is connected to a high voltage and the gate terminal of the pull-up PMOS transistor is connected to its drain terminal. The source terminal of the control PMOS transistor is connected to the drain terminal of the pull-up PMOS transistor and the gate terminal of the control PMOS transistor is connected to the low voltage. The drain terminal of the control PMOS transistor is connected to the variable resistor. The variable resistor can be a plurality of serially connected resistors, with one of its intermediate junctions serving as a voltage dividing point to produce voltage bias. The bias voltage is transmitted to the gate terminal of the second control NMOS transistor. To prevent coupling and damping effects, one or more voltage-stabilizing capacitors can be connected to the gate terminal of the second NMOS transistor.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
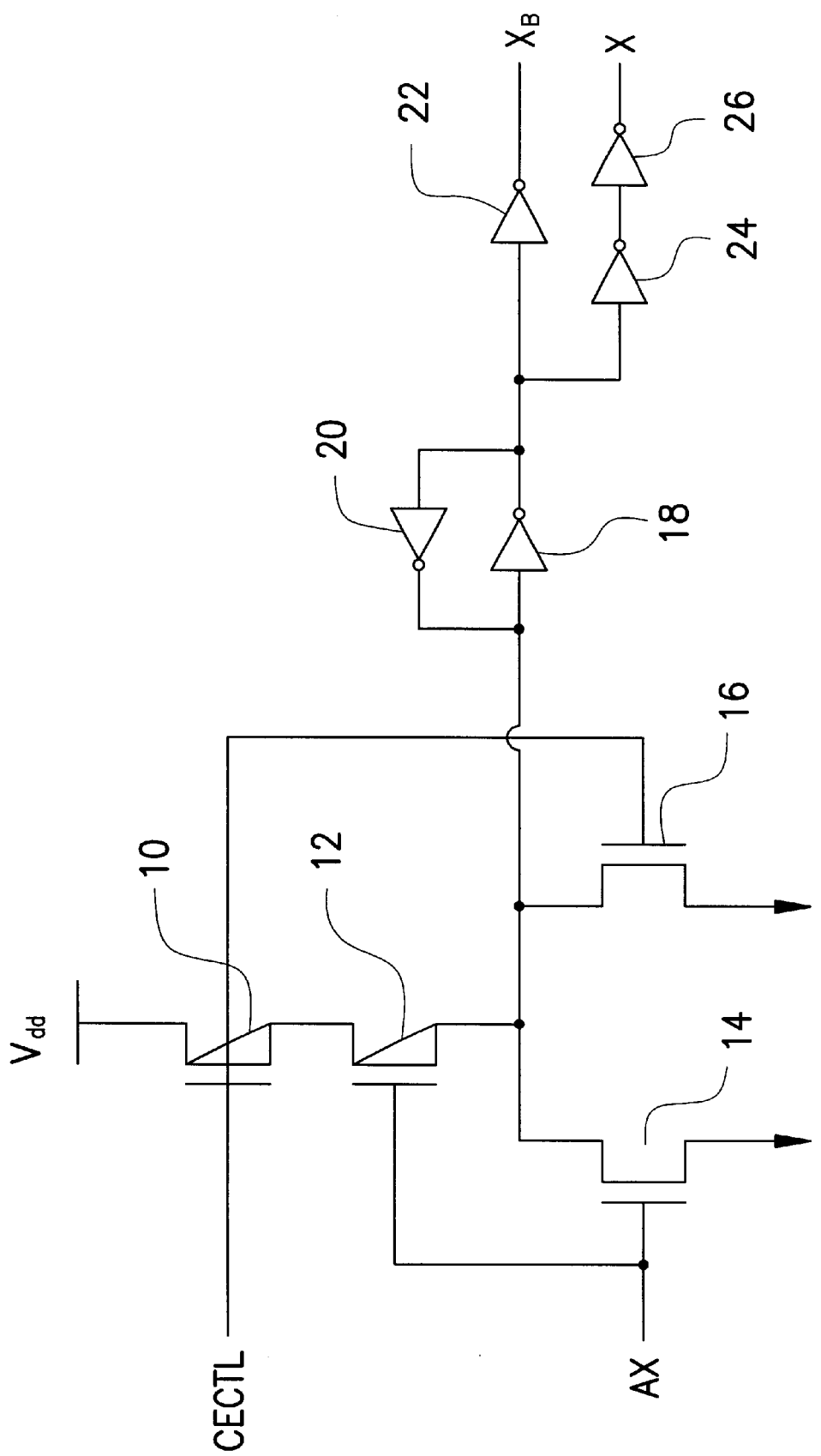
FIG. 1 is a circuit diagram of a conventional input-buffering device.

Reference will now be made in detail to the present preferred embodiments of the invention, examples of which are illustrated in the accompanying drawings. Wherever possible, the same reference numbers are used in the drawings and the description to refer to the same or like parts.

Figure 2:
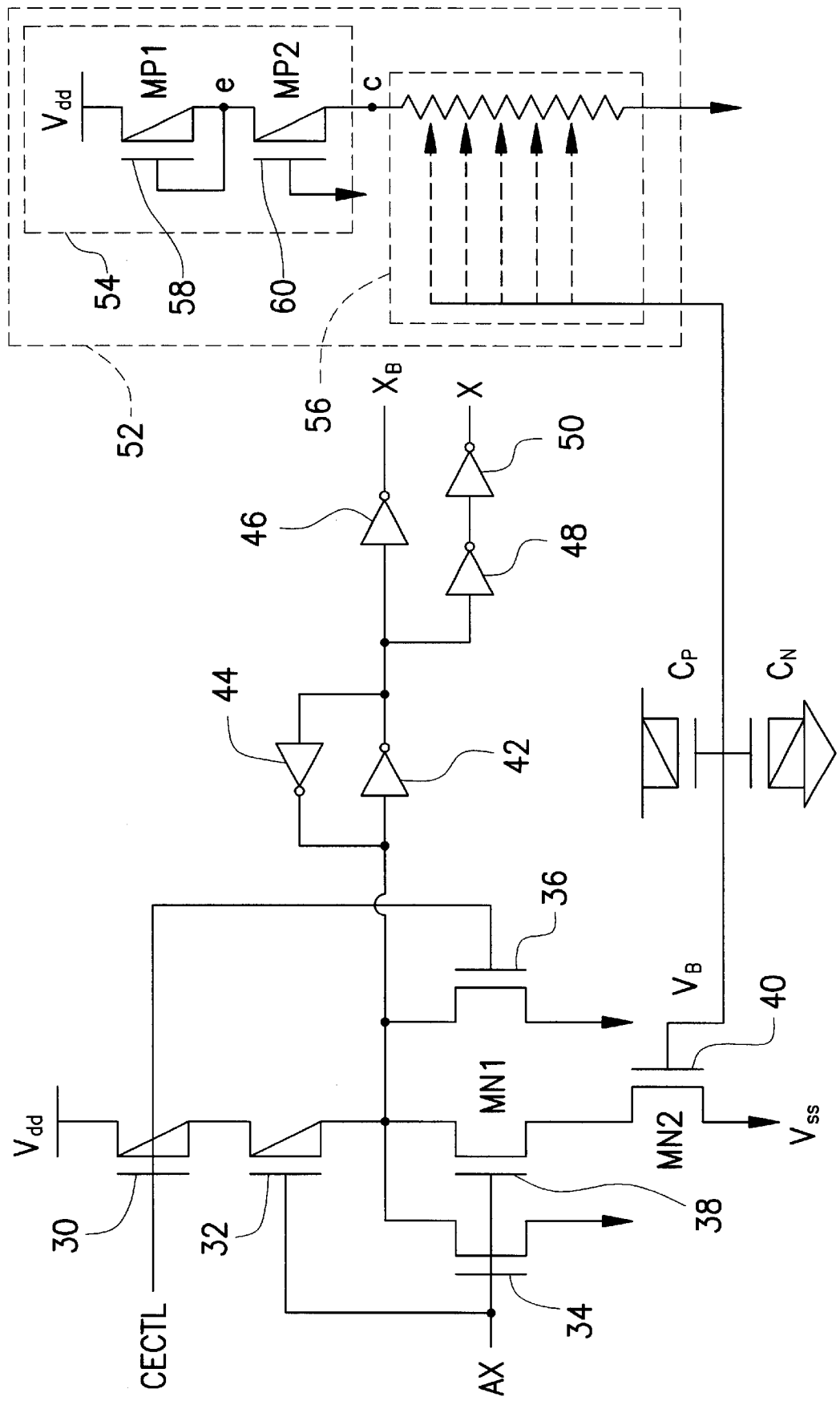
FIG. 2 is a circuit diagram showing an input-buffering device according to one preferred embodiment of this invention.

FIG. 2 is a circuit diagram showing an input-buffering device according to one preferred embodiment of this invention.

As shown in FIG. 2, the input-buffering device includes a first PMOS transistor 30, a second PMOS transistor 32, a first NMOS transistor 34, a second NMOS transistor 36, a first control NMOS transistor 38, a second control NMOS transistor 40, a first inverter 42, a second inverter 44, a third inverter 46, a fourth inverter 48, a fifth inverter 50, an adjustable voltage divider circuit 52 and two voltage-stabilizing capacitors $C_P$ and $C_N$.

The source terminal of the first PMOS transistor 30 is connected to a high voltage Vdd. The gate terminal of the first PMOS transistor 30 receives an input signal CECTL. The source terminal of the second PMOS transistor 32 is connected to the drain terminal of the first PMOS transistor 30. The gate terminal of the second PMOS transistor 32 receives a second input signal AX. The drain terminal of the first NMOS transistor 34 is connected to the drain terminal of the second PMOS transistor 32. The gate terminal of the first NMOS transistor 34 receives the second input signal AX. The source terminal of the first NMOS transistor 34 is connected to a low voltage Vss. The drain terminal of the second NMOS transistor 36 is connected to the drain terminal of the second PMOS transistor 32. The gate terminal of the second NMOS transistor 36 receives the first input signal CECTL. The source terminal of the second NMOS transistor 36 is connected to the low voltage Vss.

The input terminal of the first inverter 42 is connected to the drain terminal of the second PMOS transistor. The input terminal of the second inverter 44 is connected to the output terminal of the first inverter 42. The output terminal of the second inverter 44 is connected to the drain terminal of the second PMOS transistor 32. The input terminal of the third inverter 46 is connected to the output terminal of the first inverter 42. The output terminal of the third inverter 46 outputs a first output signal $X_B$. The input terminal of the fourth inverter 48 is connected to the output terminal of the first inverter 42. The input terminal of the fifth inverter 50 is connected to the output terminal of the fourth inverter 48. The output terminal of the fifth inverter 50 outputs a second output signal X.

In this invention, at least one transistor group is installed. FIG. 2 shows only one transistor group. The transistor group includes the first control NMOS transistor 38 and the second control NMOS transistor 40. The drain terminal of the first control NMOS transistor 38 is connected to the drain terminal of the second PMOS transistor 32. The gate terminal of the first control NMOS transistor receives from the second input signal AX. The drain terminal of the second control NMOS transistor 40 is connected to the source terminal of the first control NMOS transistor 38. The source terminal of the second control NMOS transistor 40 is connected to the low voltage Vss. The adjustable voltage divider circuit 52 generates a bias voltage signal and transmits the same to the gate terminal of the second control NMOS transistor 40.

The adjustable voltage divider circuits includes the pull-up circuit 54 and the variable resistor 56. The pull-up circuit 54 controls the value of the threshold voltage. The variable resistor 56 is connected to the pull-up circuit 54 for generating a bias voltage $V_B$. The pull-up circuit 54 comprises a pull-up PMOS transistor 58 and a control PMOS transistor 60. The source terminal of the pull-up PMOS transistor 58 is connected to the high voltage Vdd. The gate terminal of the pull-up PMOS transistor 58 is connected to its drain terminal. The source terminal of the control PMOS transistor 60 is connected to the drain terminal of the pull-up PMOS transistor 58. The gate terminal of the control PMOS transistor 60 is connected to the low voltage Vss. The drain terminal of the control PMOS transistor 60 is connected to the variable resistor 56.

The variable resistor 56 can be a device constructed by chaining together a plurality of resistors and using a definite junction point as a voltage dividing point to generate a bias voltage signal $V_B$. The bias voltage signal $V_B$ is transmitted to the gate terminal of the second control NMOS transistor 40. Two additional voltage-stabilizing capacitors can also be connected to the gate terminal of the second control NMOS transistor 40.

The adjustable voltage divider circuit 52 uses a two-stage PMOS pull-up transistor and several metal options (Metal II) (the uppermost metallic layer in the fabrication) to tap into the various junction points (shown by dash lines) of the variable resistor assembly. Hence, various combinations of voltage divider circuits are available for producing different bias voltage values ($V_B$). The bias voltages are capable of counteracting various source voltage ranges and providing a suitable bias control mechanism. In this multi-sectioned metal II option, the variable resistor is formed using a chain of poly1 resistors. The selection of voltage dividing point is determined by metal II (the uppermost metallic layer in fabrication). Only when the source voltage is greater than the threshold voltage of both MP1 and MP2 transistor is the voltage divider circuit activated. Obviously, the number of PMOS transistor stages (or NMOS transistor stages) can be extended so that source voltage value over which the voltage divider circuit is activated can be determined. To stabilize the bias voltage at the output terminal for $V_B$ against coupling and damping, voltage-stabilizing capacitors (Cp and Cn) can be added to the circuit. In addition, a group of serially connected NMOS pull-down devices controlled by input signal and $V_B$ bias voltage can be installed in the input buffer outside the NOR structure. When the bias voltage $V_B$ is greater than the threshold voltage of the NMOS transistor MN2, the ratio of value of the trigger point is shifted because one more group of serially connected NMOS transistors acts as a current sink. On the other hand, when source voltage increases to the threshold voltage of the serial-connected NMOS transistor group, the trigger point reaches a point of inflection. Thereafter, the trigger point rises slowly because of the transistors MN1 and MN2. Hence, variation of the trigger point is controlled.

As soon as the voltage source Vcc rises to MP1 the PMOS transistor conducts so that voltage at point e rises to Vcc−$|V_{Tp1}|$. Similarly, as the potential at point e is higher than MP2 $|V_{Tp2}|$, MP2 conducts and the voltage at point c rises to Vcc−$|V_{TP1}|$−$|V_{TP2}|$. Eventually, voltage at point b is determined by the metal selection in the variable resistor, thereby obtaining a suitable voltage divider point ($V_B$).

When voltage VB is greater than the MN2 $V_{TN2}$ of the newly added serial-connected NMOS transistor group on the NOR gate, the NMOS group becomes conductive, thereby changing the ratio between the original NOR gate and the P/N MOS. Hence, the rate of increase of electric potential at the trigger point (the point a) is restricted. According to simulation, the transition point occurs after the source voltage Vcc is greater than 2.5V. The transition point of the trigger point depends on the operating range of the source voltage. Using a metal option to change the bias voltage $V_B$, control of the transition point is achieved. The goal behind the design of this invention is to control the magnitude of variation of the trigger point of an input buffer against rise in source voltage Vcc so that non-uniform high-to-low or low-to-high input signal transmission is reduced. A related voltage divider circuit (for example, serially connecting several pull-up devices such as PMOS or NMOS transistor) for obtaining a desired voltage divider characteristics depends on the operating range of the source voltage. Hence, minor modifications to fit individual designs are often needed. In this respect, such modifications can be regarded as an extension to the input-buffering device of this invention.

In summary, an adjustable voltage divider circuit is used to control a first stage input buffer. Consequently, a rise in source voltage will only result in a small increase in magnitude of the trigger point. Since transmission rate is uniform, an imbalance in input signal transmission due to source voltage variation is reduced. Ultimately, data access timing of the electronic device is in an optimally balanced state.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An input-buffering device, comprising:

a first PMOS transistor, wherein a source terminal of the first PMOS transistor is connected to a high voltage and a gate terminal of the first PMOS transistor is connected to a first input signal terminal;

a second PMOS transistor, wherein a source terminal of the second transistor is connected to a drain terminal of the first PMOS transistor and a gate terminal of the second transistor is connected to a second input signal terminal;

a first NMOS transistor, wherein a drain terminal of the first NMOS transistor is connected to a drain terminal of the second PMOS transistor, a gate terminal of the first NMOS transistor is connected to the second input signal terminal, and a source terminal of the first NMOS transistor is connected to a low voltage;

a second NMOS transistor, wherein a drain terminal of the second NMOS transistor is connected to the drain terminal of the second PMOS transistor, a gate terminal of the second NMOS transistor is connected to the first input signal terminal and a source terminal of the second NMOS transistor is connected to the low voltage;

a first inverter, wherein an input terminal of the first inverter is connected to the drain terminal of the second PMOS transistor;

a second inverter, wherein an input terminal of the second inverter is connected to an output terminal of the first inverter and an output terminal of the second inverter is connected to the drain terminal of the second PMOS transistor;

a third inverter, wherein an input terminal of the third inverter is connected to the output terminal of the first inverter and an output terminal of the third inverter is connected to a first output signal terminal;

a fourth inverter, wherein an input terminal of the fourth inverter is connected to the output terminal of the first inverter;

a fifth inverter, wherein an input terminal of the fifth inverter is connected to an output terminal of the fourth inverter and an output terminal of the fifth inverter is connected to a second output signal terminal;

at least one transistor group, wherein each transistor group includes a first control NMOS transistor and a second control NMOS transistor, wherein a drain terminal of the first control NMOS transistor is connected to the drain terminal of the second PMOS transistor, a gate terminal of the first control NMOS transistor is connected to the second input signal terminal, a drain terminal of the second control NMOS transistor is connected to the source terminal of the first control NMOS transistor, and a source terminal of the second control NMOS transistor is connected to the low voltage; and an adjustable voltage divider circuit for generating a bias voltage signal to a gate terminal of the second control NMOS transistor.

2. The device of claim 1, wherein the adjustable voltage divider circuit includes a pull-up circuit for controlling a value of a threshold voltage and a variable resistor connected to the pull-up circuit for generating a bias voltage signal.

3. The device of claim 2, wherein the pull-up circuit includes:
at least a pull-up PMOS transistor, wherein a source terminal of the pull-up PMOS transistor is connected to a high voltage and a gate terminal of the pull-up PMOS transistor is connected to a drain terminal of the same; and
a control PMOS transistor, wherein a source terminal of the control PMOS transistor is connected to the drain terminal of the pull-up PMOS transistor, a gate terminal of the control PMOS transistor is connected to the low voltage and a drain terminal of the control PMOS transistor is connected to the variable resistor.

4. The device of claim 2, wherein the variable resistor comprises a plurality of serially connected resistors such that a junction between the resistors is used as a voltage divide point for generating a bias voltage signal required by the gate terminal of the second control NMOS transistor.

5. The device of claim 1, wherein the input-buffering device further includes one or more voltage-stabilizing capacitors connected to the gate terminal of the second control NMOS transistor.

6. An input-buffering device, comprising:
a first PMOS transistor, wherein a source terminal of the first PMOS transistor is connected to a high voltage and a gate terminal of the first PMOS transistor is connected to a first input signal terminal;
a second PMOS transistor, wherein a source terminal of the second PMOS transistor is connected to a drain terminal of the first PMOS transistor and a gate terminal of the second PMOS transistor is connected to a second input signal terminal;
a first NMOS transistor, wherein a drain terminal of the first NMOS transistor is connected to a drain terminal of the second PMOS transistor, a gate terminal of the first NMOS transistor is connected to the second input signal terminal, and a source terminal of the first NMOS transistor is connected to a low voltage;
a second NMOS transistor, wherein a drain terminal of the second NMOS transistor is connected to the drain terminal of the second PMOS transistor, a gate terminal of the second NMOS transistor is connected to the first input signal terminal and a source terminal of the second NMOS transistor is connected to the low voltage;
a first inverter, wherein an input terminal of the first inverter is connected to the drain terminal of the second PMOS transistor;

a second inverter, wherein an input terminal of the second inverter is connected to an output terminal of the first inverter and an output terminal of the second inverter is connected to the drain terminal of the second PMOS transistor;
a third inverter, wherein an input terminal of the third inverter is connected to an output terminal of the first inverter and an output terminal of the third inverter is connected to a first output signal terminal;
a fourth inverter, wherein an input terminal of the fourth inverter is connected to the output terminal of the first inverter;
a fifth inverter, wherein an input terminal of the fifth inverter is connected to an output terminal of the fourth inverter and an output terminal of the fifth inverter is connected to a second output signal terminal;
at least one transistor group, wherein each transistor group includes a first control NMOS transistor and a second control NMOS transistor, wherein a drain terminal of the first control NMOS transistor is connected to the drain terminal of the second PMOS transistor, a gate terminal of the first control NMOS transistor is connected to the second input signal terminal, a drain terminal of the second control NMOS transistor is connected to a source terminal of the first control NMOS transistor, and a source terminal of the second control NMOS transistor is connected to the low voltage;
a pull-up PMOS transistor, wherein a source terminal of the pull-up transistor is connected to a high voltage and a gate terminal of the pull-up PMOS transistor is connected to a drain terminal of the same;
a control PMOS transistor, wherein a source terminal of the control PMOS transistor is connected to a drain terminal of the pull-up PMOS transistor and the gate terminal of the control PMOS transistor is connected to the low voltage; and
a variable resistor, wherein one terminal of the variable resistor is connected to the drain terminal of the control PMOS transistor and the other terminal of the variable resistor is connected to a gate terminal of the second control NMOS transistor.

7. The device of claim 6, wherein the variable resistor comprises a plurality of serially connected resistors such that a junction between the resistors is used as a voltage divide point for generating a bias voltage signal required by the gate terminal of the second control NMOS transistor.

8. The device of claim 6, wherein the input-buffering device further includes at least one voltage-stabilizing capacitor connected to the gate terminal of the second control NMOS transistor.

* * * * *